United States Patent [19]

Bibring et al.

[11] 3,985,582

[45] Oct. 12, 1976

[54] PROCESS FOR THE IMPROVEMENT OF REFRACTORY COMPOSITE MATERIALS COMPRISING A MATRIX CONSISTING OF A SUPERALLOY AND REINFORCING FIBERS CONSISTING OF A METAL CARBIDE

[75] Inventors: Herve Bibring, Meudon; Jean-Pierre Trottier, Bagneux; Tasadduq Khan, Plessis-Robinson; Jean-Francois Stohr, Bourg-la-Reine; Maurice Rabinovitch, Chatillon, all of France

[73] Assignee: Office National d'Etudes et de Recherches Aerospatiales (O.N.E.R.A.), Chatillon, France

[22] Filed: July 18, 1974

[21] Appl. No.: 489,482

[30] Foreign Application Priority Data

July 30, 1973 France .............................. 73.27854

[52] U.S. Cl. ........................................ 148/3; 148/2; 148/32.5; 148/39; 148/158; 148/162; 75/171
[51] Int. Cl.² ..................... B22D 25/00; C22C 19/05
[58] Field of Search .................. 75/170, 171; 148/2, 148/3, 32, 32.5, 162, 158, 34, 39

[56] References Cited
UNITED STATES PATENTS

| | | | |
|---|---|---|---|
| 3,649,378 | 3/1972 | Kotval | 75/171 |
| 3,649,379 | 3/1972 | Kotval | 75/171 |
| 3,753,790 | 8/1973 | Walker et al. | 148/3 |
| 3,783,032 | 1/1974 | Walker et al. | 148/3 |
| 3,793,010 | 2/1974 | Lemkey et al. | 75/171 |
| 3,793,012 | 2/1974 | Walter et al. | 75/171 |
| 3,793,013 | 2/1974 | Walter et al. | 75/171 |
| 3,871,835 | 3/1975 | Bibring et al. | 75/170 |

*Primary Examiner*—Walter R. Satterfield
*Attorney, Agent, or Firm*—Karl F. Ross; Herbert Dubno

[57] ABSTRACT

Composite materials which comprise a matrix of a complex refractory superalloy and embedded in said matrix filiform particles of carbide and, in the matrix, a fine precipitation of carbide of the same nature as the one of the filiform particles.

7 Claims, 8 Drawing Figures

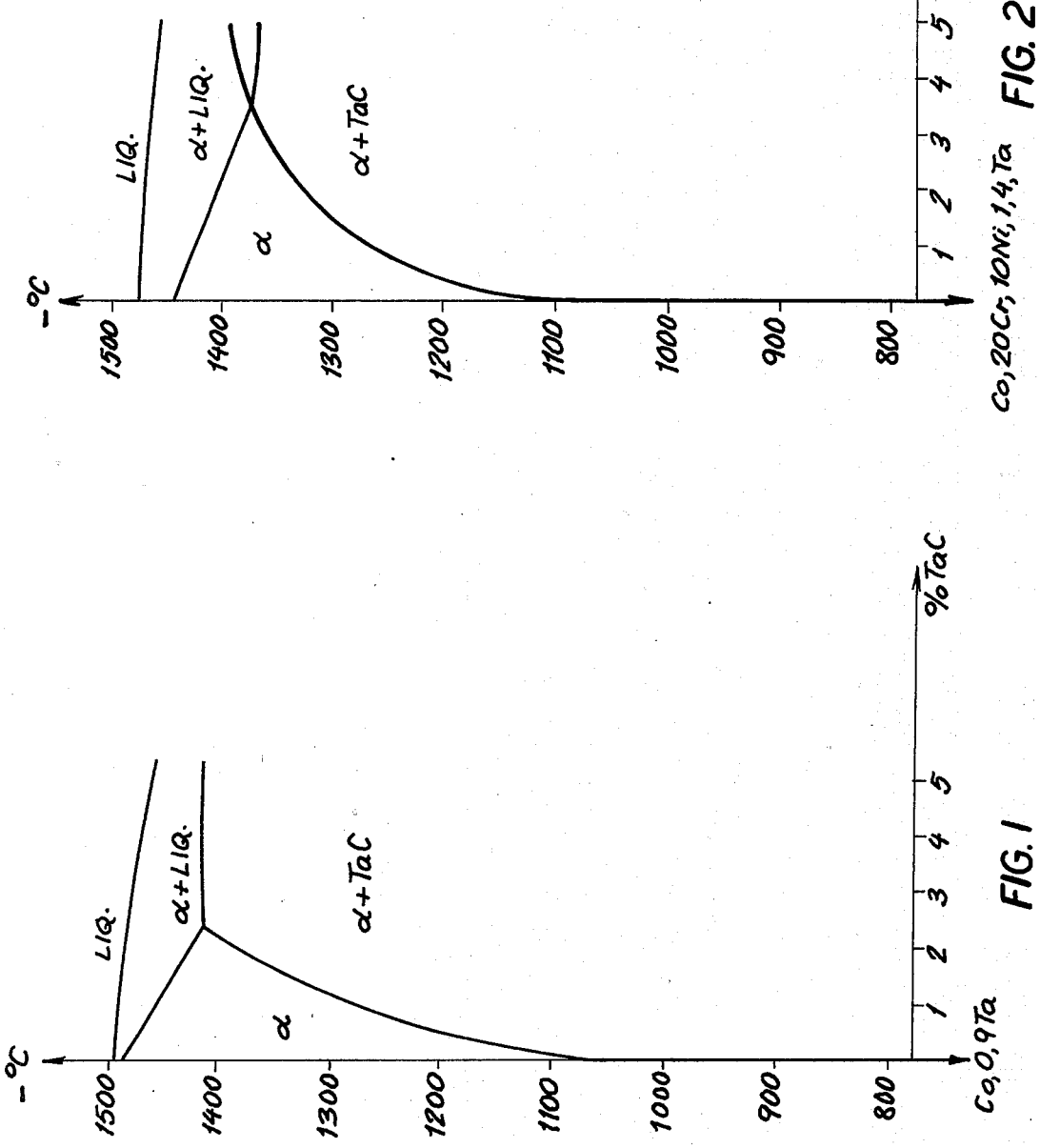

PROCESS FOR THE IMPROVEMENT OF REFRACTORY COMPOSITE MATERIALS COMPRISING A MATRIX CONSISTING OF A SUPERALLOY AND REINFORCING FIBERS CONSISTING OF A METAL CARBIDE

FIELD OF THE INVENTION

The invention relates to composite materials produced by oriented solidification, comprising a matrix consisting of a refractory superalloy and reinforcing fibers consisting of a metal carbide.

BACKGROUND OF THE INVENTION

Composite materials are known, which comprise a complex matrix, based on cobalt, iron or nickel, enriched with chromium, and a reinforcing phase consisting of monocrystalline fibers or whiskers of transition metal monocarbides such as TaC, NbC, TiC, ZrC or HfC, it being possible for these whiskers to consist of only one of these monocarbides or of a mutual solid solution of two or three of these carbides.

Such materials, which are described in U.S. Pat. application Ser. No. 2,160 of Jan. 12, 1970 (replaced by Ser. No. 268,751, now U.S. Pat. No. 3,871,835) in the name of the present Assignee, possess outstanding properties, and especially great mechanical strength, are devoid of both tensile fragility and impact fragility, and possess excellent resistance to oxidation and to corrosion at high temperatures, and resistance to creep and to fatigue under hot conditions which is greater than that of the best superalloys previously known.

In the patent application mentioned above, it was proposed to increase the hardness of the matrix by providing a component which, during a heat treatment of the material, first enters into solid solution and then afterwards leads to a precipitation which hardens the latter. However, this measure can only be applied to matrices based on nickel, the presence of a certain proportion of aluminum or of aluminum and titanium, making it possible to form a coherent $\gamma'$ phase, $Ni^3AL$ or $Ni_3(Al,Ti)$, which precipitates. In a matrix based on cobalt or iron, the precipitation is not stable at the temperatures contemplated for using the material.

SUMMARY OF THE INVENTION

The invention is based on the observation that, although the composites mentioned above possess great stability at high temperatures, especially with respect to the carbide fibers embedded in the matrix, nevertheless partial dissolution in the matrix of the carbide or carbides forming the reinforcing fibers takes place at temperatures close to the melting point of the matrix, in principle of the order of only 50° C below the latter.

It has been found that, surprisingly, this slight solubility of the fibers in the matrix does not change the morphology of the material, and in particular leaves the fibers completely intact from the point of view of their structure and their properties, that the matrix is not altered and that a reprecipitation treatment makes it possible to produce, within the matrix, a very fine stable precipitate of carbide particles which have a hardening effect on the matrix.

This is a general phenomenon and makes it possible substantially to improve refractory metallic composite materials the matrix of which is based on cobalt, iron or nickel, and which contains reinforcing fibers as are produced by unidirectional solidification.

The process according to the invention is characterised in that the composite material, or a part made from this material, is heated to a temperature close to the melting point of the superalloy forming its matrix, but of the order of 50° C below the latter, that the composite is kept at this temperature for a sufficient period of time to bring about partial dissolution in the matrix of the carbide or carbides forming the reinforcing fibers, and that the composite material is then cooled suddenly in order to keep the dissolution in the metastable state, precipitation of the dissolved carbide or carbides being produced subsequently by an aging treatment.

In the majority of cases, the dissolution treatment is carried out at a temperature above 1,100° C and below or equal to 1,300° C, and the aging treatment is carried out at a temperature of between 600° and 1,100° C.

In a first embodiment, the aging treatment is carried out during the manufacture of the part: after cooling, the latter is heated to an aging temperature, below the dissolution temperature, for a sufficient period of time to enable precipitation of the dissolved carbide or carbides to take place.

In a first method of carrying out the process, after heating to effect partial dissolution of the carbide forming the fibers, the part is cooled to ordinary temperature and is heated thereafter at an aging temperature for a sufficient period of time to enable precipitation to take place.

In a second method of carrying out the process, still belonging to the first embodiment, sudden cooling from the partial dissolution temperature brings the material to an aging temperature which is maintained for a sufficiently long time to enable precipitation to take place.

In either of the methods for carrying out the process, the aging can take place at a single temperature or at several temperatures, and in every case the temperature is maintained for a sufficient period of time which depends on the composition of the material.

In a second embodiment, the part made from the composite material, as is produced by a process of oriented solidification, is first heated at the partial dissolution temperature for a sufficient period of time to enable a portion of the carbide fibers to dissolve in the matrix and is then cooled suddenly to ordinary temperature, and it is only when the part begins to be utilized that precipitation takes place, this embodiment being applicable when the contemplated use temperature is precisely an aging temperature.

The invention can be applied generally to refractory composites produced by unidirectional solidification.

It finds an advantageous use even for composites of which the matrix contains an element which, in solid solution, increases the hardness thereof, such as tungsten, molybdenum or rhenium.

It can be applied both to composites, the unidirectional solidification of which was produced with a relatively slow rate of movement of the solidification front, and to composites for which the solidification was produced with a faster rate of movement of the solidification front.

Thorough thermal analysis of the complex systems has made it possible to observe that at very high temperatures, close to the melting point, refractory monocarbides of transition metals from groups IV and V of the periodic classification of the elements show slight solubility in Ni, in Fe or in Co as well as in alloys based on each of these metals.

Similar partial solubility has been discovered in the composites resulting from oriented solidification, which consist of an alloy of these metals forming the matrix, and of a monocarbide or a solid solution of monocarbides of TaC, NbC and the like, forming the reinforcing fibers.

BRIEF DESCRIPTION OF THE DRAWING

Other features and advantages of our invention will be clear from the following description given with reference to the accompanying drawing in which:

FIGS. 1, 2 and 3 are diagrams; and

SPECIFIC DESCRIPTION

Figure 3:
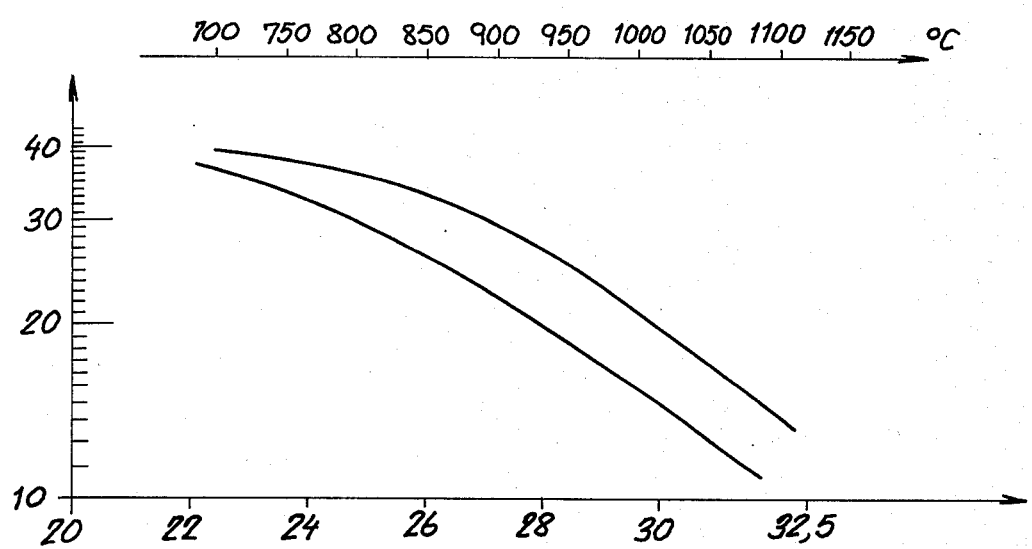

Reference is first made to FIG. 1 which represents the pseudo-binary section of the (Co, 0.9% Ta)-TaC phase diagram. This diagram shows that the solubility of the carbide TaC, which is insignificant up to 1,100° C, being less than 0.1%, reaches a value of 1.2% at 1,300° C.

FIG. 2 represents the pseudo-binary section of the phase diagram corresponding to the more complex system (Co, 20 Cr, 10 Ni, 1.4 Ta)-TaC. In this case, the solubility of TaC reaches 1.9% at 1,300° C.

Example 1

A composite material of the following composition by weight.

| | | |
|---|---|---|
| Cr | : | 20% |
| Ni | : | 10% |
| Ta | : | 13.1% |
| C | : | 0.78% |
| Co | : | sufficient for 100% | was produced by unidirectional solidification, the solidification front moving at the rate of 1 cm/hour, with a heat gradient of 100° C/cm at the liquid-solid interface.

The material obtained was heated to 1,300° C and kept at this temperature for two hours, and then, immediately afterwards, was cooled suddenly by quenching in water.

The micro-hardness of the matrix was measured by placing a sample of the material on a microscope stage and making impressions selectively on the matrix using a diamond point with a divergence angle of 136° C under a load of 5.4 g. The micro-hardness of the matrix, determined by averaging ten measurements, was found to be 367.

Similar measurements of micro-hardness, made on the composite material before heating to effect partial dissolution, gave the matrix a micro-hardness of 356.

The remaining treatment of the material, namely heating to effect precipitation, takes place during the first stage of using the part made from this material, at an aging temperature, or as in the examples below.

Example 2

The starting material is the same as in Example 1. It is heated in the same way to effect partial dissolution and is quenched in water. The material is then heated to a temperature of 700° C, at which it is kept for 24 hours. Cooling to ambient temperature is carried out in air.

The same measurements of micro-hardness of the matrix yield a value of 411.6 for the latter.

Example 3

The initial procedure is as in Example 2. However, after quenching in water, the composite is heated to an aging temperature not of 700° C but of 800° C, and is kept there at for 2 hours. The value of the micro-hardness of the matrix was then found to be 406.

Example 4

The procedure of Examples 2 and 3 is followed, but the aging temperature is 900° C. The value of the micro-hardness of the matrix is then 411. The part was then heated to a temperature of 1,070° C and was kept thereat for 100 hours. The micro-hardness of the matrix was still 406, showing that prolonged heating at a very high temperature does not change the hardening produced by aging.

Example 5

The procedure of the above Examples 2 to 4 is followed, but the aging temperature is 1,000° C. The micro-hardness of the matrix then has a value of 415.2.

Example 6

The same composite material as in the preceding examples is used as the starting material. The first stage of the treatment is identical to that of Example 1: the material is heated to 1,300° C and is kept thereat for 2 hours. However, instead of quenching it in water thereafter, the composite is cooled suddenly to 700° C and is kept at this temperature for 24 hours. The composite is then cooled in air. The value of the micro-hardness of the matrix is then 403.2.

Example 7

The same composite material as in Example 1 is used as the starting material; it is also heated to 1,300° C and is kept at this temperture for 2 hours. This is followed by quenching in water. For the aging process, the material is kept at 800° C for 24 hours and then thereafter at 1,000° C for a further 24 hours.

The table below gives the above examples again and mentions at the end examples in which the duration of the dissolution treatment for the same composite was not 2 hours, as in the preceding examples, but only 1 hour.

TABLE 1

| Heat treatment | Micro-hardness of the matrix (average of 10 measurements) |
|---|---|
| (1) untreated state | 356 |
| (2) 1,300°C/2 hours/water | 367 |
| (3) 1,300°C/2 hours/water + 700°C/24 hours/air | 411.6 |
| (4) 1,300°C/2 hours/water + 800°C/24 hours/air | 406 |
| (5) 1,300°C/2 hours/water + 900°C/24 hours/air | 411 |
| (6) 1,300°C/2 hours/water + 1,000°C/24 hours/air | 415.2 |

TABLE 1-continued

| Heat treatment | Micro-hardness of the matrix (average of 10 measurements) |
|---|---|
| (7) 1,300°C/2 hours/water + 700°C/24 hours/air + 1,000°C/24 hours/air | 448 |
| (7') 1300°C/2 hrs/water+800°C/24 hrs/air+1000°C/24 hrs/air | 420 |
| (8) 1,300°C/2 hours/water + 900°C/24 hours/air + 1,070°C/100 hours/air | 406 |
| (9) 1,300°C/2 hours → 700°C/24 hours/air | 403.2 |
| (10) 1,300°C/1 hour/water + 1,000°C/24 hours/air | 410 |
| (11) 1,300°C/1 hour/water + 1,000°C/16 hours/air | 411 |
| (12) 1,300°C/1 hour/water + 1,000°C/8 hours/air | 417 |
| (13) 1,300°C/1 hour/water + 1,000°C/4 hours/air | 420 |

Example 8

A refractory composite material based on cobalt with reinforcing fibers of tantalum carbide, having the following composition by weight:

| | | |
|---|---|---|
| Cr | : | 20% |
| Ni | : | 10% |
| Ta | : | 13.2% |
| W | : | 5% |
| C | : | 0.78% |
| Co | : | sufficient for 100% | is formed by unidirectional solidification with a rate of movement of the solidification front of 1.18 cm/hour under a heat gradient of 150° C/cm.

The matrix of such a composite, hardened by the presence of tungsten in solid solution, has a micro-hardness of 394.8.

This composite material is heated to 1,300° C and is kept at this temperature for 2 hours, and is then cooled suddenly by quenching in water. The micro-hardness of the matrix has changed to a value of 451.3.

The composite was then aged by keeping it at 900° C for 24 hours. The subsequent cooling takes place in air. The micro-hardness of the matrix has become 477.7.

The stability of the precipitation produced is of the same order as in the composite of the preceding examples. It is noticeably effective at all the use temperatures.

Example 9

A composite material having the same composition by weight as in Example 8 is used as the starting material, but it is formed by oriented solidification with a solidification front moving at the rate of 1.6 cm/hour.

The composite material is heated at 1,300° C for 2 hours and is then quenched in water. It is then heated at 1,000° C for 24 hours and is left to cool in air.

Example 10

A refractory metallic composite material corresponding to the following composition by weight:

| | | |
|---|---|---|
| Cr | : | 20% |
| Ni | : | 10% |
| Ta | : | 9.7% |
| Hf | : | 2.5% |
| C | : | 0.80% |
| Co | : | sufficient for 100% | was produced by unidirectional solidification, the solidification front moving at the rate of 1.15 cm/hour with a heat gradient of the solid-liquid interface of 150° C/cm.

In this composite, the reinforcing fibers consist of a mutual solid solution of TaC and HfC monocarbides.

The composite is subjected to a treatment for effecting partial dissolution of the carbide fibers in the matrix by heating at 1,300° C for 2 hours. The composite is then quenched in water and heated at 1,000° C for 24 hours, after which it is cooled in air.

Example 11

A composite material, the composition by weight of which is as follows, is used as the starting material:

| | | |
|---|---|---|
| Cr | : | 18% |
| Ni | : | 10% |
| Al | : | 0.2% |
| Ta | : | 7.4% |
| Nb | : | 3.55% |
| C | : | 0.85% |
| Co | : | sufficient for 100% |

It was formed by unidirectional solidification, the solidification front moving at a rate of 1.18 cm/hour with a heat gradient of 150° C/cm at the solid-liquid interface. The micro-hardness of the matrix is 442.4.

The material is subjected to a heat treatment which consists of heating for 2 hours at 1,300° C, followed by quenching in water, which is followed by aging consisting of heating for 24 hours at 1,000° C. The cooling takes place in air. The micro-hardness of the matrix has changed to 471.

Example 12

A composite material having the following composition by weight is used as the starting material:

| | | |
|---|---|---|
| Cr | : | 10% |
| Ni | : | 20% |
| W | : | 5% |
| Nb | : | 8% |
| C | : | 0.85% |
| Co | : | sufficient for 100% |

It was formed by unidirectional solidification with a solidification front moving at a rate of 1.2 cm/hour.

The composite material is heated at 1,300° C for 2 hours and is then quenched in water. It is then heated at 1,000° C for 24 hours and cooled in air.

Example 13

A composite material having the following composition by weight is used as the starting material:

| | | |
|---|---|---|
| Cr | : | 18% |
| Ni | : | 9.15% |
| W | : | 3% |
| Mo | : | 2% |
| Ta | : | 12.55% |
| C | : | 9.75% |
| Co | : | sufficient for 100% |

It was formed by oriented solidification with a solidification front moving at the rate of 0.8 cm/hour.

The composite material is subjected to a heat treatment by heating at 1,300° C for 2 hours and quenching it in water; after this, it is heated at 1,000° C for 24 hours and left to cool in air.

Test pieces which have been machined from composite materials having compositions as indicated above and which have been subjected to treatments defined in the examples, after a surface-protection treatment by the process described in French Pat. No. 1,490,744, in the name of the Applicant, filed on June 24, 1966, were subjected to various creep and cycling, tests, as defined below:

Test 1

A test piece, made from the material, the composition and heat treatment of which are those of Example 5, was subjected to a creep test in air at 1,070° C, under a stress of 18 hbars. After 500 hours, the test piece has not ruptured.

FIG. 3 shows values of the Larson-Miller parameter, namely $P = T(20 + \log t)10^{-3}$ with the stress $\delta$ in hectobars as the ordinates and, on the upper horizontal scale, the temperature in degrees centigrade for a working life of 1,000 hours. The lower curve of this diagram relates to a test piece made from the composite material, the composition of which is that defined in Example 1 but which has not undergone a heat treatment according to the invention. The upper curve relates to a test piece made from the composite material which has the same composition but which has not undergone the treatment defined in Example 5.

It is found that the treatment yielded:

a gain in temperature of 80° C for withstanding the same duration under the same stress, or a gain in strength of 5 hbars at the same temperature for the same duration.

Test 2

A test piece identical to the above was subjected to a creep test at 1,000° C in air under a stress of 24 hbars. The test piece did not rupture over the course of 470 hours.

This result corresponds to a gain in temperature of 100° C and to an increase in strength of more than 7 hbars at the same temperature for a same duration relative to a test piece made from a composite material which has the same composition but has not undergone the heat treatment according to the invention.

Test 3

A test piece, identical to the above, was subjected to a creep test in air at 800° C under a stress which increased as follows:

firstly, for 1,000 hours under a stress of 35 hbars; no rupture took place;

then the stress was raised to 37 hbars for 24 hours; no rupture took place;

finally, the stress was raised to 40 hbars and rupture took place only after 90 hours.

Test 4

A test piece, identical to the above, was subjected to a heat cycling test under external mechanical strain. This heat cycle comprised keeping the temperature at 1,000° C for one minute thirty seconds followed by rapid cooling and rapidly raising the temperature to 1,000° C in air. The total duration of a cycle is three minutes.

With a fixed external stress of 16 hbars applied to the test piece, the latter held without rupturing for 2,500 cycles.

Test 5

A test piece, prepared from the composite material produced according to Example 9, was subjected to a heat cycling test in air at 1,000° C under an applied mechanical stress of 16 hbars. It does not rupture over the course of 10,000 cycles.

Test 6

A test piece, identical to that used for the preceding test, was subjected to a heat cycling test in air at 1,050° C under 12 hbars, without rupturing at 4,500 cycles.

Test 7

A test piece, identical to those used in the two preceding tests, was subjected to a heat cycling test in air at 1,050° C under an applied stress of 14 hbars, without rupturing over the course of 2,750 cycles.

Test 8

A test piece, prepared from the composite material produced according to Example 12, was subjected to a creep test in air at 800° C under a stress of 40 hbars. It does not rupture over the course of 480 hours, which means a gain of more than 8 hbars at this temperature, equivalent to a shift of approximately 100° C in the temperature scale.

Test 9

A test piece, prepared from the composite material produced according to Example 13, was subjected to a heat cycling stress test: it does not rupture over the course of 2,500 heat cycles at 1,050° C in air under an applied fixed stress of 12 hbars.

In general terms, micrographic observations show that the morphology of the composite material is not affected by the heat treatment according to the invention for effecting partial dissolution of the carbide.

The reduction in the cross-section of the fibers can be as much as 15%, but the dissolution is homogeneous.

Figure 4:
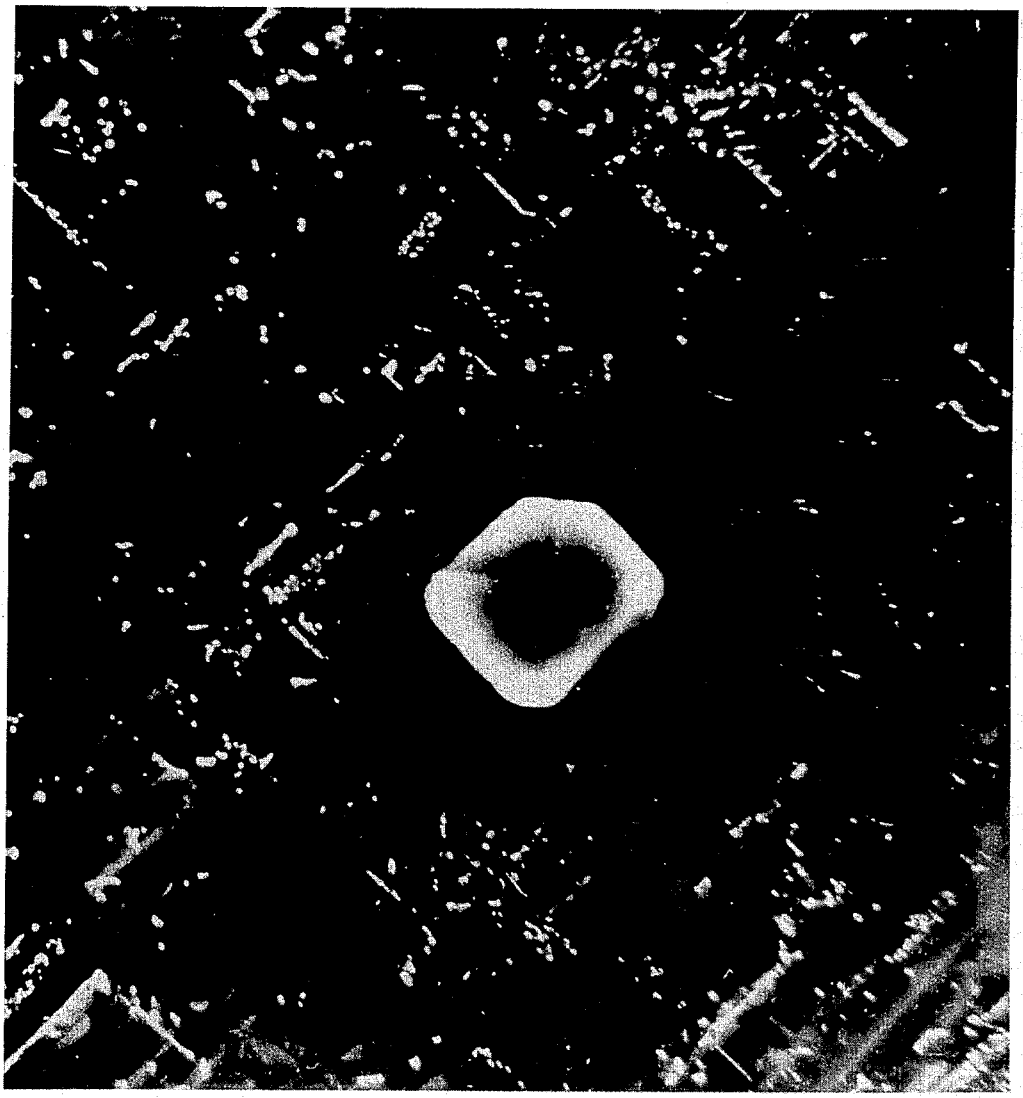
FIGS. 4–8 are photomicrographs of materials according to the invention.

FIG. 4 is a direct dark-field transmission electron micrograph of a transverse cross-section of the treated composite material produced as in Example 6 above. The magnification is 33,000. The matrix appears dark and the TaC fiber light. The micrograph makes it possible to recognize the fine dispersion of carbide by the light dots and lines visible on the dark background.

The precipitation is of a similar form and is distributed in a similar manner in the case of a composite material produced by a treatment involving intermediate quenching in water.

Figure 5:

FIG. 5, which is an electron micrograph at a magnification of 26,000 of a longitudinal cross-section of the treated composite material produced as in Example 1 above, shows that the heat treatment does not affect the shape of the fibers: the latter remain unchanged, with smooth edges.

Furthermore, the number and the distribution of the fibers are not affected by the dissolution treatment and the distance between fibers remains constant.

The mechanical characteristics of the composite retain the same values, due to the reinforcement achieved by the fibers.

The precipitation treatment which follows the dissolution gives rise to a fine dispersion of carbide, in the form of polyhedra epitaxed to the matrix.

These precipitates have the same composition and the same structure as the fibers and their size does not exceed 300 A.

Figure 6:
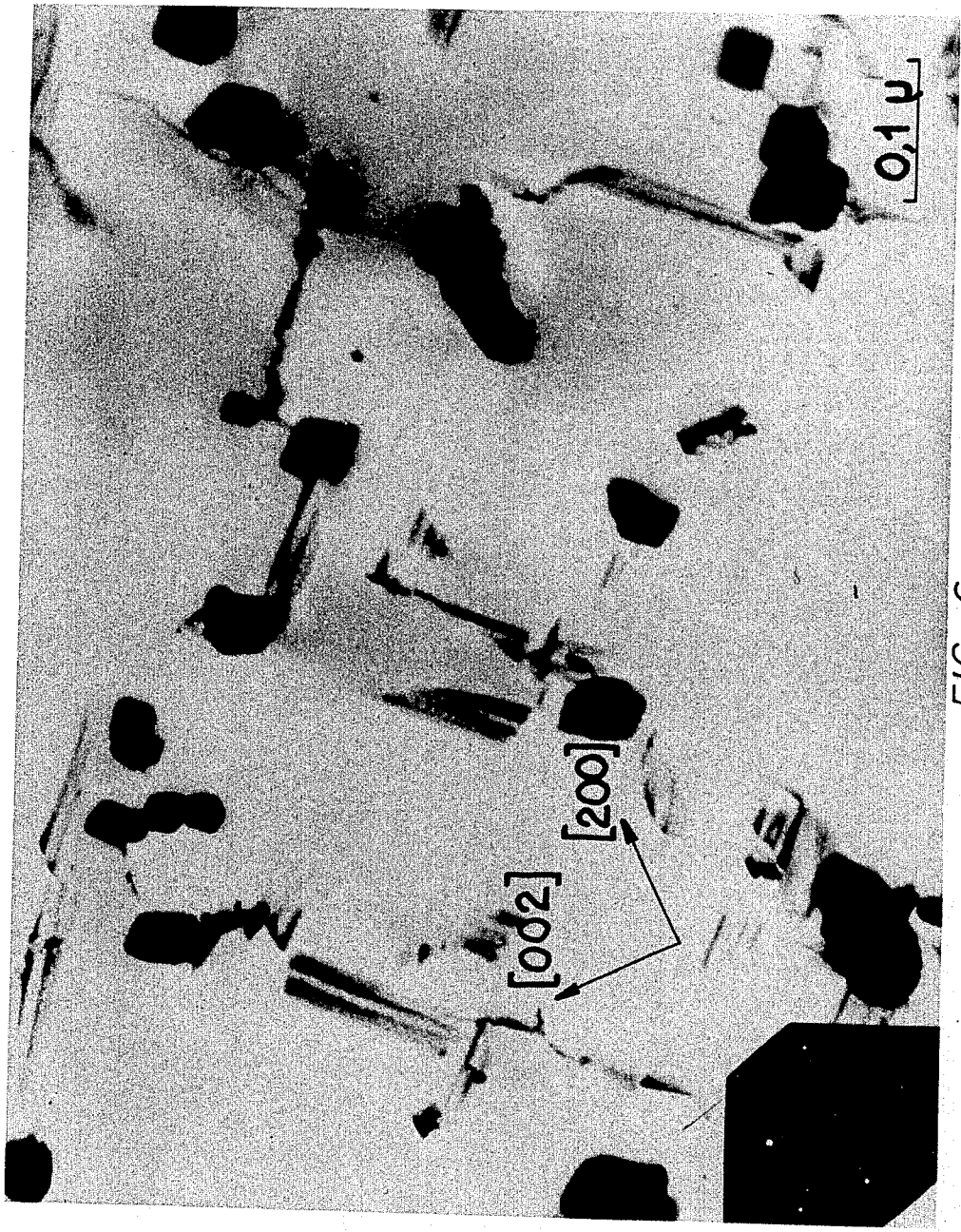

FIG. 6 shows the appearance of these precipitates at a high magnification of ×260,000, for the treated composite material produced as in Example 5 above.

Figure 7:
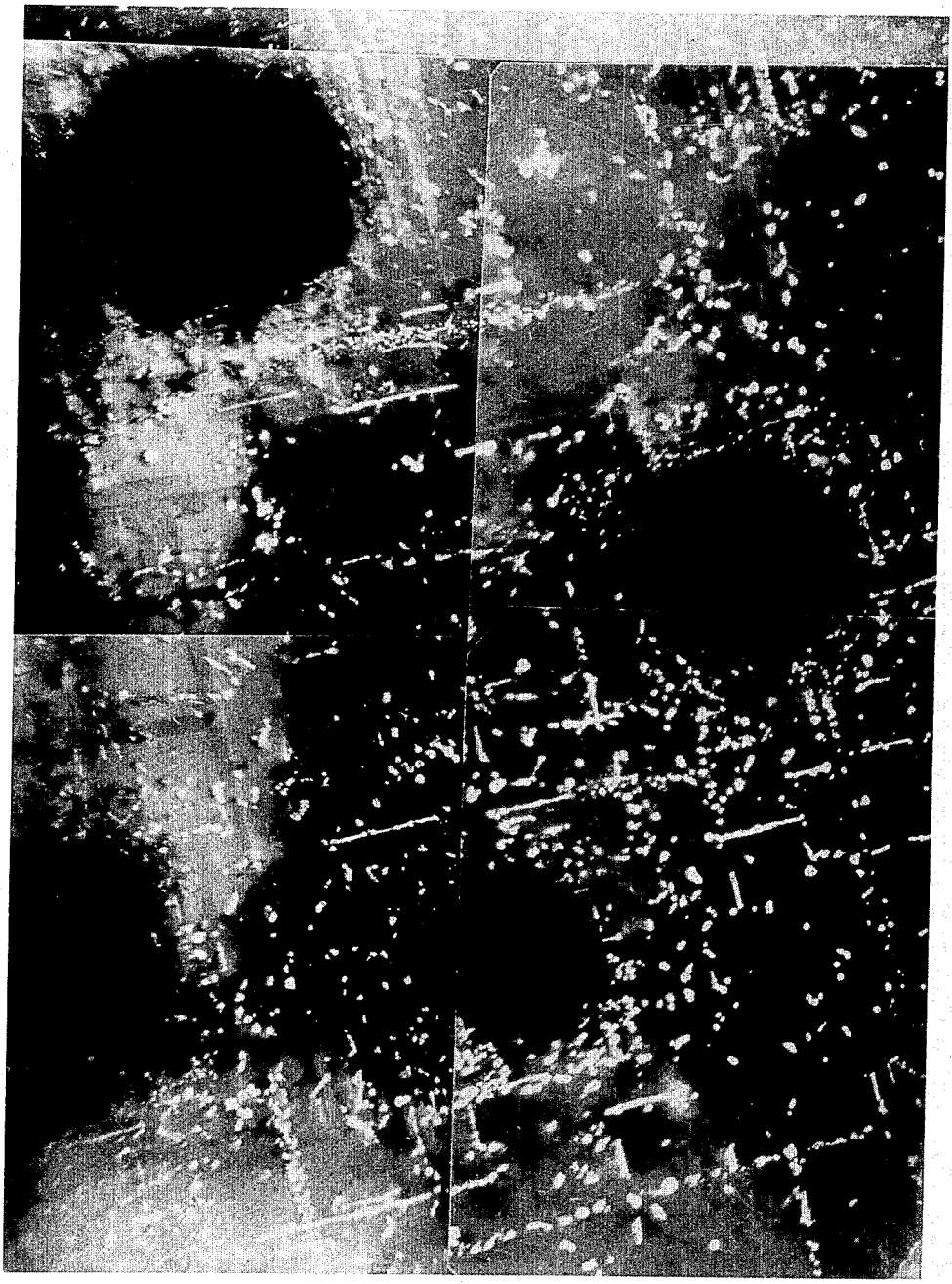

FIG. 7, a wide-angle micrograph (magnification 42,000) makes it possible to observe the uniform distribution of the precipitation throughout the matrix of the treated composite material produced according to Example 7 above.

Figure 8:

FIG. 8 is an electron micrograph produced by scanning the treated composite material obtained according to Example 10 above. This micrograph (magnification 14,000) shows that the composite comprises, in addition to the reinforcing fibers, the transverse cross-sections of which are shown by the large light spots, a dispersed fine precipitation shown by the small light dots and the small light lines. This carbide-type precipitation, of the same nature as the fibers, is present preferentially at the grain boundaries and along precise crystallographic directions which are slip lines. This arrangement is typical of a composite which, after quenching, has undergone high temperature aging.

In the case of low temperature aging or aging by a heat treatment effected in steps (isothermal transformation after dissolution without intermediate quenching), the precipitation is more general.

The heat treatment according to the invention can be applied to materials and parts made from refractory composites based on cobalt, produced by oriented solidification, the composition of which corresponds to:

| chromium | between 10 and 20% |
|---|---|
| nickel | between 0 and 30% |
| tantalum | between 0 and 14% |
| niobium | between 0 and 9% |
| carbon | between 0.7 and 1% |
| cobalt | sufficient for 100%. |

It can be applied to materials and parts made from refractory composites produced by oriented solidification of a composition based on nickel, corresponding to:

| chromium | between 10 and 20% |
|---|---|
| cobalt | between 0 and 30% |
| aluminum | between 0 and 6% |
| tantalum | between 0 and 18% |
| niobium | between 0 and 9% |
| carbon | between 0.4 and 0.9% |
| nickel | sufficient for 100%. |

We claim:
1. A process for making an improved refractory metallic composite material which comprises the steps of:
   a. directionally solidifying a metal-alloy melt having the following composition:

| chromium | between 10% and 20% |
|---|---|
| nickel | between 0% and 30% |
| tantalum | between 0% and 14% |
| niobium | between 0% and 9% |
| carbon | between 0.7% and 1% |
| cobalt | sufficient for 100% |
| chromium | between 10% and 20% |
| cobalt | between 0% and 30% |
| aluminum | between 0% and 6% |
| tantalum | between 0% and 18% |
| niobium | between 0% and 9% |
| carbon | between 0.4% and 0.9% |
| nickel | sufficient for 100% | and further including:
   a. an effective amount of at least one hardening element selected from the group which consists of tungsten, molybdenum and rhenium, said tungsten being present in an amount up to 10% by weight of the composite, said molybdenum being present in an amount up to 5% by weight of the composite and said rhenium being present in an amount up to 5% by weight of the composite to form (1) a superalloy complex matrix phase consisting predominantly of cobalt, nickel or combinations thereof and chromium, and (2) a monocrystalline reinforcing fiber phase consisting of monocarbides of the transition metals of groups IV and V;
   b. reheating the material directionally solidified in step (a) to a temperature approximately 50° C below the melting point of the material for a period sufficient to attain the new equilibrium conditions corresponding to a superficial solubilization of said fiber phase in said matrix phase; and
   c. aging the directionally solidified material subsequent to said solubilization at a temperature of 700° C to 1100° C for a period of four to twenty four hours to precipitate the previously solubilized carbide in finely divided polyhedral form through the matrix phase and in an amount effective to increase the hardness of the composite.

2. The process defined in claim 1, further comprising the step of:
   d. rapidly cooling to room temperture the material heated in step (b) prior to aging in step (c).

3. The process defined in claim 2 wherein the material is reheated for step (c) subsequent to cooling in step (d).

4. The process defined in claim 1 wherein the material subsequent to step (b) is brought directly to the aging temperature of step (c) to precipitate the previously solubilized carbide.

5. The process defined in claim 1 wherein, during step (c), the material is heated from a first aging temperature to a second aging temperature higher than the first aging temperature.

6. The process defined in claim 1 wherein step (b) is carried out for a period of one to two hours at a temperature of about 1300° C.

7. The refractory metallic composite made by the process of claim 1.

* * * * *